United States Patent
Nemoto (10) Patent No.: US 6,680,958 B1
(45) Date of Patent: Jan. 20, 2004

(54) SEMICONDUCTOR LASER AND METHOD OF PRODUCTION OF THE SAME

(75) Inventor: Kazuhiko Nemoto, Kanagawa (JP)

(73) Assignee: Sony Corporation, Tokyo (JP)

(*) Notice: Subject to any disclaimer, the term of this patent is extended or adjusted under 35 U.S.C. 154(b) by 251 days.

(21) Appl. No.: 09/656,705

(22) Filed: Sep. 7, 2000

(30) Foreign Application Priority Data

Sep. 8, 1999 (JP) .............................. 11-254784

(51) Int. Cl.[7] ............................ H01S 5/00; H01S 3/091; H01L 33/00
(52) U.S. Cl. ............................ 372/43; 372/50; 372/75; 257/89; 257/99; 257/96
(58) Field of Search ...................... 372/43, 50, 75; 257/89, 99, 96

(56) References Cited

U.S. PATENT DOCUMENTS 5,459,337 A * 10/1995 Ito et al. ........................ 257/89
5,793,790 A *  8/1998 Doi et al. ...................... 372/50

FOREIGN PATENT DOCUMENTS

JP         6-104526      * 4/1994

* cited by examiner

*Primary Examiner*—Eddie Lee
*Assistant Examiner*—Joseph Nguyen
(74) *Attorney, Agent, or Firm*—Sonnenschein, Nath & Rosenthal LLP (57) ABSTRACT

A semiconductor laser capable of emitting a plurality of laser light having different oscillation wavelengths which is formed with dielectric films having little fluctuation in reflectance at ends of a plurality of active layers and a method of production of the same, said semiconductor laser having a plurality of active layers having different compositions on a substrate and emitting in parallel a plurality of laser light having different oscillation wavelengths, wherein a front dielectric film having a predetermined thickness by which a reflectance with respect to light of a predetermined wavelength of an arithmetical mean of oscillation wavelengths becomes the extremal value is formed on an end of the laser emission side, while rear dielectric films having higher reflectances compared with the front dielectric film and having predetermined thicknesses by which reflectances with respect to light having a predetermined wavelength become the extremal values are formed on the end of the rear side, and a method of producing the same.

10 Claims, 10 Drawing Sheets

SEMICONDUCTOR LASER AND METHOD OF PRODUCTION OF THE SAME

RELATED APPLICATION DATA

The present application claims priority to Japanese Application No. P11-254784 filed Sep. 8, 1999, which application is incorporated herein by reference to the extent permitted by law.

BACKGROUND OF THE INVENTION

1. Field of the Invention

The present invention relates to a semiconductor laser comprised of a plurality of laser diodes having different oscillation wavelengths formed on an identical substrate and a method of producing the same, more particularly relates to a semiconductor laser having a reflection film for controlling a laser output formed on an end of each laser diode and a method of producing the same.

2. Description of the Related Art

As optical disc-shaped recording media for recording and/or reproducing information by emitting light (hereinafter referred to as optical discs), for example, compact discs (CD), Mini Discs (MD), digital versatile discs (DVD), etc. are irradiated with lights of different wavelengths in accordance with the type of the optical discs. For example, light of a wavelength of the 780 nm band is used for reproduction of data from a CD, while light of a wavelength of the 650 nm band is used for reproduction of data from a DVD.

An optical recording and/or reproducing apparatus able to handle different kinds of optical discs requires a plurality of light sources having different oscillation wavelengths. An optical recording and/or reproducing apparatus normally uses a laser diode as a light source, however, when forming a plurality of laser diodes, it becomes difficult to make the apparatus compact and the process of production becomes complex as well.

To overcome the above disadvantages, a multiple wavelength monolithic semiconductor laser formed with a plurality of laser diodes having different oscillation wavelengths on a single substrate has been developed.

Generally, semiconductor lasers are roughly divided into an end emission type laser for emitting laser light in parallel to an active layer, and a surface radiating type (surface emission type) laser.

A surface emission type laser is capable of performing single mode oscillation and able to be used for long distance transmission, high speed transmission optical fiber communication etc., so the surface emission type multiple wavelength laser has drawn attention as a light source for parallel optical communication.

On the other hand, a laser used for data-recording on and data-reproducing from an optical disc preferably has a plurality of longitudinal modes in the gain spectrum because even if there are a plurality of longitudinal modes, the spatial coherence is not particularly deteriorated and because of the noise problem occurred when light is reflected from the disc and returns to the laser. An end emission type laser has a resonator overwhelmingly longer than the wavelength in a crystal and a large number of resonance modes in the resonator. Therefore, the end emission type laser is suitable as an optical pickup for CDs, MDs, DVDs, and other optical discs.

The configuration of a semiconductor laser of an end emission type will be explained with reference to FIG. 5.

Figure 5A:
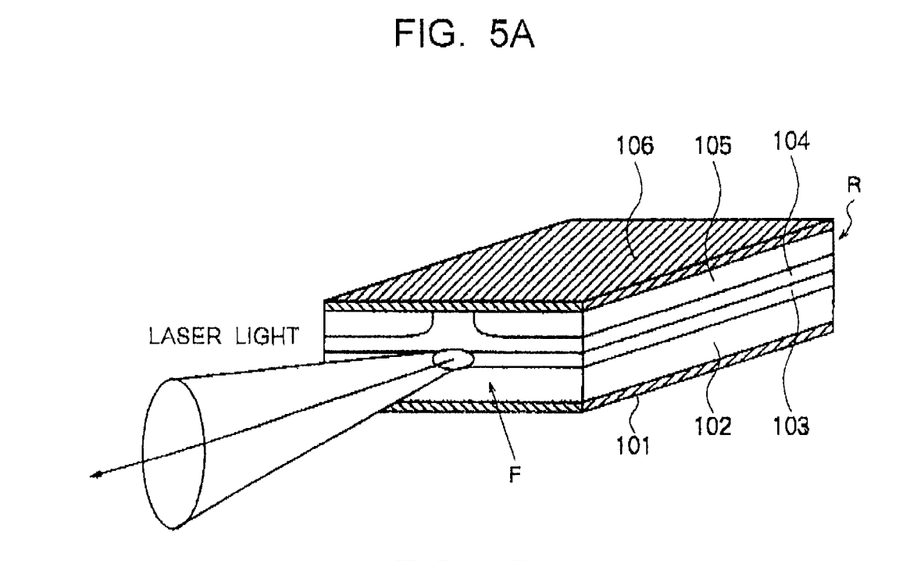
FIGS. 5A and 5B are perspective and top views of a semiconductor laser of an end emission type of the related art.
Figure 5B:
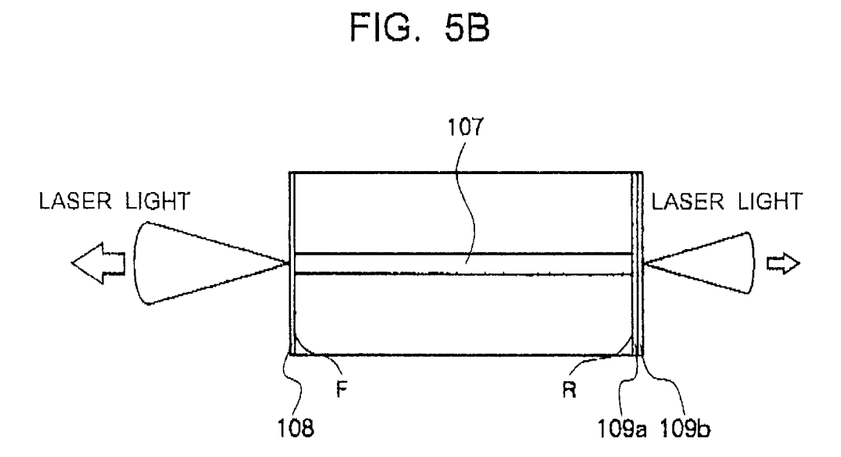

As shown in the perspective view of FIG. 5A, an n-cladding layer 102 comprised for example of n-AlGaAs, a pn junction (active layer) 103 comprised for example of GaAs, and a p-cladding layer 104 comprised for example of p-AlGaAs are successively stacked on a substrate 101 comprised for example of n-GaAs. On the surface of the p-cladding layer 104 except for a striped area at the center is formed a high resistance layer 105. At an upper layer of the p-cladding layer 104 or the high resistance layer 105 is formed a p-electrode 106.

The high resistance layer 105 is formed by ion implantation of n-type impurities in the surface of the p-cladding layer 104. The striped area sandwiched between the parts of the high resistance layer 105 is left as a low resistance layer. By selectively forming the high resistance layer 105, the result is a gain waveguide structure (current constricting structure) as shown in the top view of FIG. 5B. It becomes possible to control the area in which the current flows, that is, the area where an optical gain is generated.

According to the laser of the above configuration, a resonator is formed in the active layer 103. As shown in FIG. 5B, although laser light 1 is emitted from a front end F, it is partially lost from the rear end R. The two ends of the emission area (optical waveguide path) 107, that is, the front end F and the rear end R, are mirror surfaces.

In order to make the ends mirror surfaces, a semiconductor wafer is normally cleaved. Alternatively, the mirror surfaces are sometimes formed by etching instead of cleaving. Also, dielectric films are sometimes formed on the cleaved facets in order to control the reflectance of the ends and to prevent the deterioration of the cleaved facts.

As the dielectric films formed on the ends, single-layer films of for example $Al_3O_3$, amorphous silicon, $SiO_2$, or $Si_3N_4$ or multi-layer films comprised of a stack of these films may be used. By changing the thicknesses of the dielectric films, the reflectances of the ends can be adjusted. By making the front end F a low reflectance for example less than 30% and the rear end R a high reflectance for example more than 50%, preferably more than 70%, high output laser light can be obtained. The energy conversion efficiency, the front/rear output ratio, etc. depends on the reflectance. Accordingly, the dielectric film controlling the reflectance of the end is one of the important design parameters of a semiconductor laser.

The thickness of the dielectric film formed on an end is, when the oscillation wavelength is $\lambda$, normally designed based on $\lambda/2$ or its odd multiple or $\lambda/4$ or its odd multiple. For example, in FIG. 5B, when forming a dielectric film 108 on the front end F by using $Al_2O_3$ having an oscillation wavelength $\lambda$ of 785 nm and a reflectance $n_1$ of 1.62, the thickness $d_{108}$ of the dielectric film 108 is determined as follows:

$$d_{108}=(\lambda/2)/n_1 \approx 242.3 \text{ (nm)} \tag{1}$$

Also, the rear end R has to have a high reflectance, however, when using the above $Al_2O_3$ etc. as a single layer, since the reflectance becomes less than 50% in any case, a plurality of dielectric films are formed. As shown in FIG. 5B, in the case of the oscillation wavelength λ of 785 nm, when forming for example an $Al_2O_3$ film having as a first dielectric film 109a and an amorphous silicon film as a second dielectric film 109b, the thicknesses of the layers are determined for example as follows. The thickness $d_{109a}$ of an $Al_2O_3$ film having a reflectance $n_1$ of 1.62 becomes $$d_{109a}=(\lambda/4)/n_1 \approx 121.1(\text{nm}) \quad (2)$$

and the thickness $d_{109b}$ of an amorphous silicon film having a reflectance $n_2$ of 3.25 becomes $$d_{109b}=(\lambda/4)/n_2 \approx 60.4(\text{nm}) \quad (3)$$

Figure 6:
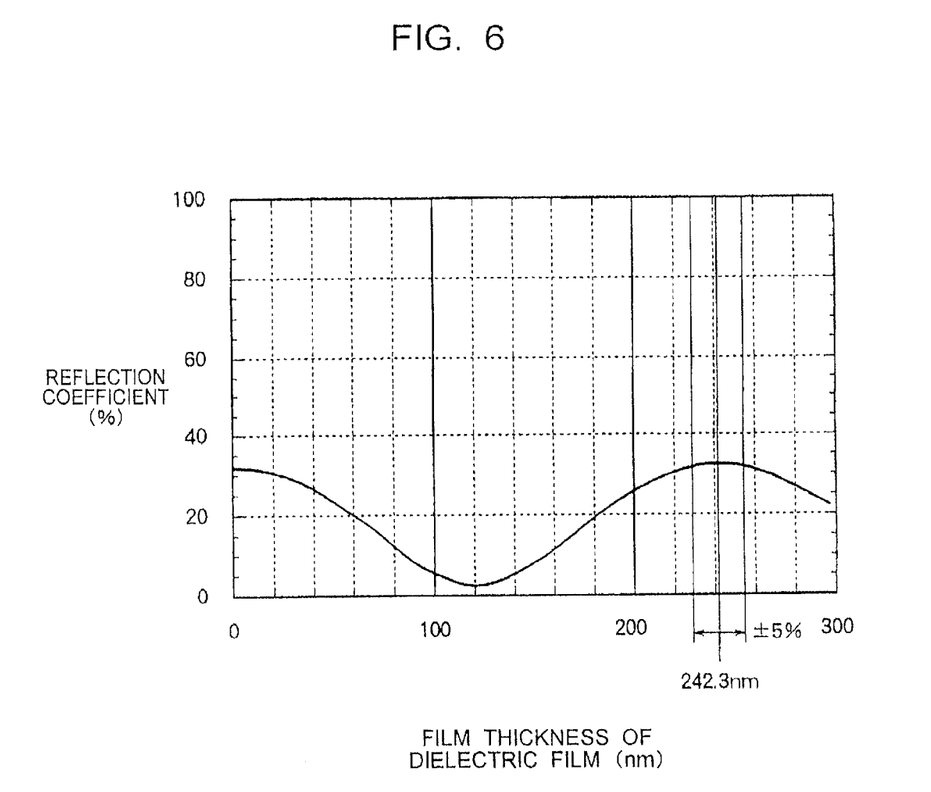
FIG. 6 is a view of a thickness of a dielectric film formed on a front end of a semiconductor laser in FIG. 5 and a reflectance.
Figure 7:
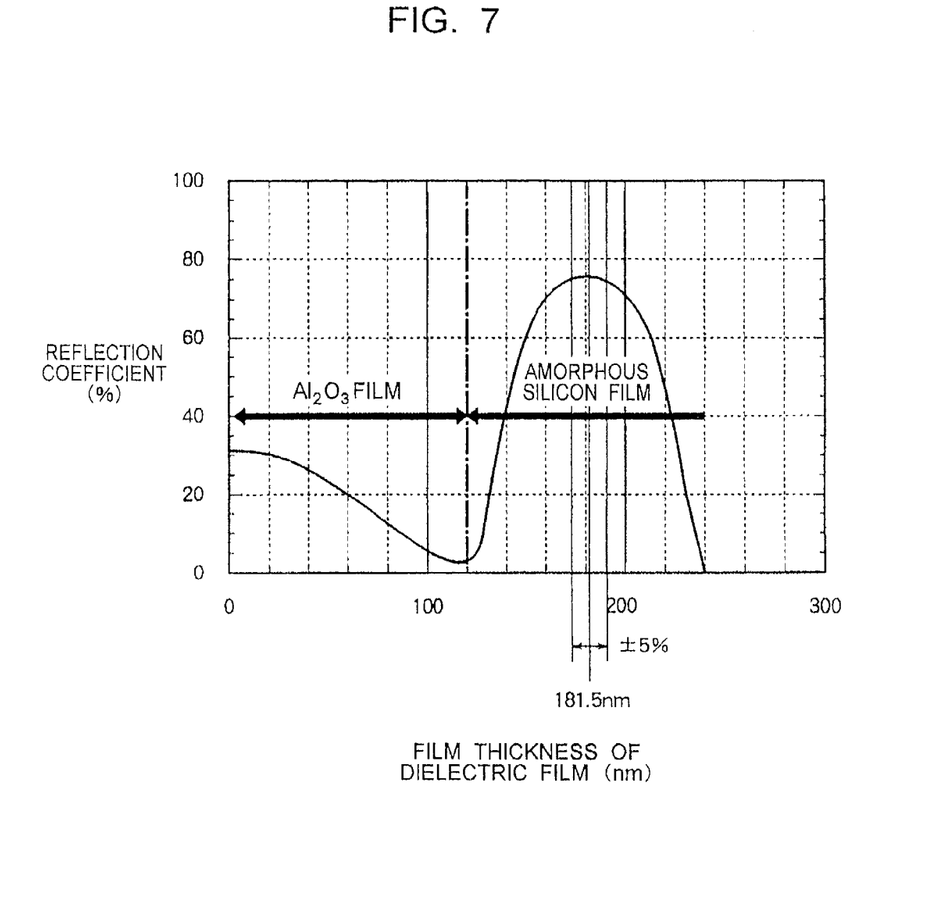
FIG. 7 is a view of a thickness of a dielectric film formed on a rear end of a semiconductor laser in FIG. 5 and a reflectance.

FIG. 6 is a graph showing the relationship of the thickness of the $Al_2O_3$ formed on the front end F and the reflectance of the front end F. FIG. 7 is a graph showing the relationship of the thickness of the $Al_2O_3$ film and amorphous silicon film formed on the rear end R with the reflectance of the rear end R. The oscillation wavelength λ is assumed to be 785 nm in both FIG. 6 and FIG. 7.

As shown in FIG. 6, by making the thickness of the dielectric film of the front end F the above $d_{108}$ and making the thickness of the dielectric film of the rear end R a combination of the above $d_{109a}$ and $d_{109b}$, the reflectances becomes the extremal values. Accordingly, it is possible to reduce the fluctuations in the reflectances accompanying variations in film formation.

By making the thicknesses of the dielectric films formed on the ends λ/2 or its odd multiple or λ/4 or its odd multiple or a combination of these, it becomes easy to obtain stable reflectances even when there is variation in the thicknesses or refractive indexes due to variation in the formation of the dielectric films.

In the case of a multiple wavelength monolithic semiconductor laser, ideally dielectric films are formed on the laser diodes having different oscillation wavelengths by the above design of the related art.

In this case, however, the production process becomes complex and the increase of the number of the production steps becomes a problem. When forming, for example, a CD playback laser diode and DVD playback laser diode on an identical substrate, an end of one, for example, the DVD laser diode (wavelength of 650 nm band) is masked and, in that state, a dielectric film is formed on an end of the CD laser diode (wavelength of 780 nm band).

To avoid the increase of the number of production steps as in the above case, there is the method of matching the optimal wavelength of the end coatings with one of the laser diodes and simultaneously forming end coatings on the plurality of laser diodes on the same substrate. In this case, however, while a reflectance stable against variations in film formation can be obtained for the laser diode of the design wavelength, the stability against variations in film formation of the reflectances of the other laser diodes is sacrificed.

The method has also been considered of reducing the fluctuations in the reflectances of the dielectric films of the ends of the plurality of laser diodes formed monolithically by calculating the optimal thickness for each of the laser diodes and forming in common dielectric films having thicknesses of the least common multiple of these values.

Figure 8:
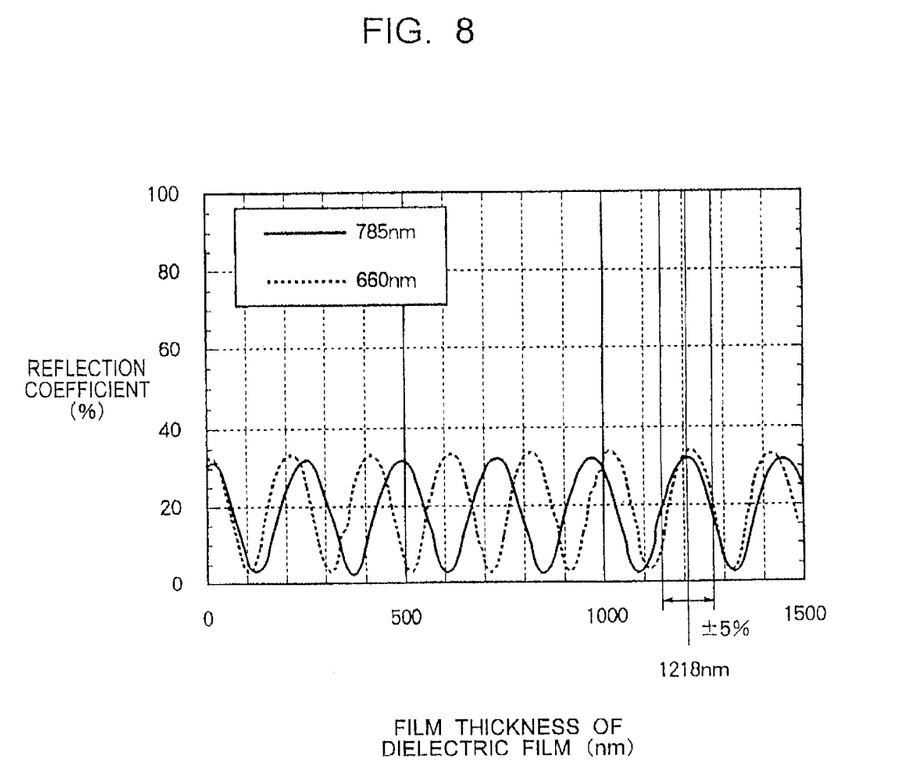
FIG. 8 is a view of cyclic fluctuation of a reflectance along with changes of a thickness of a dielectric film in a multiple wavelength monolithic semiconductor laser.

FIG. 8 is a graph showing examples of the cyclical fluctuation of reflectance when changing the thickness of a dielectric film. FIG. 8 shows the reflectances of a dielectric film comprised by $Al_2O_3$ with respect to laser light of a wavelength of 785 nm or 660 nm.

The optimal thickness of a dielectric film for laser light having a wavelength of 785 nm is 242.3 nm as defined in formula (1). From a similar calculation, the optimal thickness of a dielectric film for laser light having a wavelength of 440 nm is 203.7 nm. The reflectances for light having wavelengths of 785 nm and 660 nm become extremal at the least common multiple of the two thicknesses, that is, 1218 nm.

In this case, however, the dielectric film becomes extremely thick and the time for formation becomes long, so the production efficiency is low. Furthermore, due to the large thickness, the fluctuation in the reflectance becomes large when the variation of the formation becomes more pronounced.

SUMMARY OF THE INVENTION

An object of the present invention is to provide a semiconductor laser, formed with a plurality of active layers different in material and composition on an identical substrate and capable of emitting a plurality of laser light having different oscillation wavelengths, where dielectric films having little fluctuations in reflectance are formed at ends of the plurality of active layers.

Another object of the present invention is to provide a method of producing the above laser.

To achieve the above object, the semiconductor laser of the present invention is a semiconductor laser having a plurality of active layers of different composition on a substrate and emitting in parallel a plurality of laser light of different oscillation wavelengths, said laser comprising a front surface coating film formed on a front end of a laser emission side and a rear surface coating film formed on a rear end at a back side of said front end and having a higher reflectance compared with said front surface coating film and by thicknesses of said front surface coating film and said rear surface coating film being set to predetermined thicknesses giving reflectances of extremal values with respect to light of a predetermined wavelength between the minimum value and the maximum value of said oscillation wavelength.

Preferably, the predetermined wavelength is an arithmetical mean of oscillation wavelengths of said plurality of laser beams.

Preferably, the front surface coating film is comprised of a dielectric. Preferably, the rear surface coating film is comprised of a dielectric.

Preferably, the front surface coating film is comprised of a plurality of layers. Preferably, the rear surface coating film is comprised of a plurality of layers.

Preferably, the predetermined thickness of said front surface coating film is a value expressed by $(\lambda/2)/n_F$ when said predetermined wavelength is λ and the reflectance of said front surface coating film is $n_F$.

Preferably, the rear surface coating film is comprised of stacked films of a first rear surface coating film having a reflectance $n_{Ra}$ and a second rear surface coating film having a reflectance $n_{Rb}$; said predetermined thickness of said first rear surface coating film is a value expressed by $(\lambda/4)/n_{Ra}$ when said predetermined wavelength is $\lambda$; and said predetermined thickness of said second rear surface coating film is a value expressed by $(\lambda/4)/n_{Rb}$ when said predetermined wavelength is $\lambda$.

Preferably, the active layer is formed at an interlayer bonding portion of a first conductivity type cladding layer and a second conductivity type cladding layer.

Preferably, the active layer has a current constricting structure.

The reflectance of the end can be stabilized for each of the plurality of laser diodes having different oscillation wavelengths formed on the identical substrate. If forming a dielectric film having a thickness optimized with respect to the oscillation wavelength of the laser diode on an end of each laser diode, while a stable reflectance can be obtained even when there is variation in the thicknesses of the dielectric films, the production steps becomes complex. According to the semiconductor laser of the present invention, dielectric films of a common thickness are formed on the plurality of laser diodes. By suitably adjusting the thickness of the dielectric films, the reflectances at the ends of the plurality of laser diodes can be stabilized.

To attain the above object, the method of producing semiconductor laser of the present invention is a method of producing a semiconductor laser for forming two laser diodes having different oscillation wavelengths on a substrate, characterized by including the steps of successively causing epitaxial growth of a first cladding layer, an active layer, and a second cladding layer for forming a first laser diode on a substrate to form a first stack; removing portions of said first stack other than said first laser diode; successively causing epitaxial growth of a first cladding layer, an active layer, and a second cladding layer for forming a second laser diode on a substrate to form a second stack; removing portions of said second stack other than said second laser diode and spatially separating said first stack and second stack; forming an electrode on a said laser diode; forming a front surface coating film having a predetermined thickness optimized with respect to a predetermined wavelength of an arithmetical mean of said oscillation wavelengths on an end of a laser emission side of a said laser diode; and forming a rear surface coating film having a predetermined thickness optimized with respect to said predetermined wavelength having a higher reflectance compared with said front surface coating film on an end of a back side of said laser emission side.

Preferably, the step of forming a front surface coating film and said step of forming a rear surface coating film are steps for forming films using a dielectric as a material.

According to the above method of producing a semiconductor laser of the present invention, the compositions of first and second stacks including the active layers can be made mutually different and a two-wavelength monolithic semiconductor laser can be formed by a simple process. Furthermore, since the front surface dielectric films or rear surface dielectric films are commonly formed on the two laser diodes, a semiconductor laser wherein the reflectances of the ends are prevented from fluctuation can be produced by a simple process.

BRIEF DESCRIPTION OF THE DRAWINGS

These and other objects and features of the present invention will become clearer from the following description of the preferred embodiments given with reference to the accompanying drawings, in which.

DESCRIPTION OF THE PREFERRED EMBODIMENTS

Figure 1A:
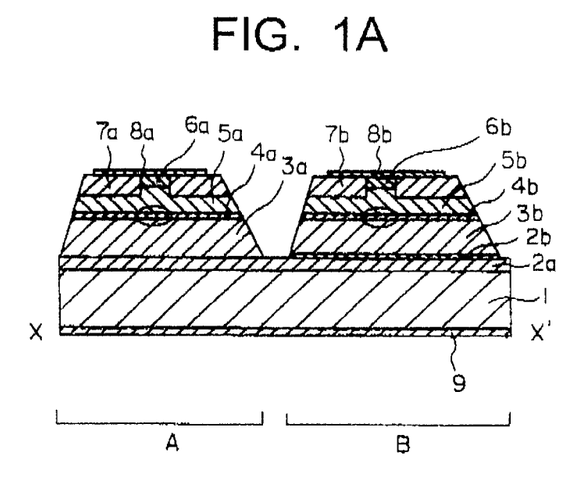
FIGS. 1A and 1B are sectional and top views of a semiconductor laser shown in an embodiment of the present invention.
Figure 1B:
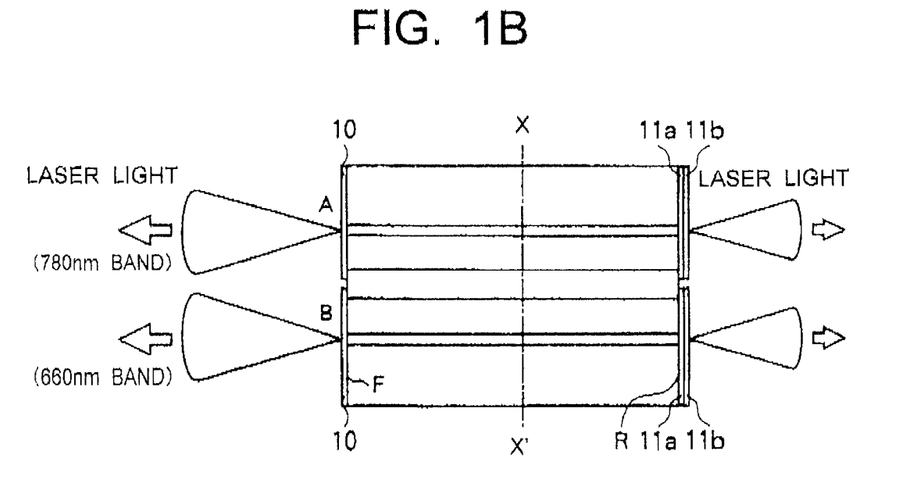

Below, preferred embodiments of a semiconductor laser and method of production of the present invention will be explained with reference to the drawings. FIG. 1A is a sectional view of a semiconductor laser of the present embodiment, and FIG. 1B is a corresponding top view. FIG. 1A is a sectional view along the line X–X' in FIG. 1B.

In the semiconductor laser of the present embodiment, as shown in the sectional view of FIG. 1A, an n-GaAs buffer layer 2a is formed on a substrate 1 comprised of n-GaAs. A laser diode A for emitting light having a wavelength of the 780 nm band and a laser diode B for emitting light having a wavelength of the 650 nm band are formed thereon. The interval between an emission part of the laser diode A and an emission part of the laser diode B is less than 200 $\mu$m, for example less than 100 $\mu$m, in many cases.

In a portion of the laser diode A, an n-cladding layer 3a comprised of n-AlGaAs, an active layer 4a comprised of GaAs, a p-cladding layer 5a comprised of p-AlGaAs, and a cap layer 6a comprised of p-GaAs are successively stacked on the n-GaAs buffer layer 2a. A high resistance layer 7a is formed on the surface of the p-cladding layer 5a leaving behind a striped shaped center portion. The result is a gain guide type current constricting structure. At an upper part of the cap layer 6a is formed a p-type electrode 8a comprised of stacked films of Ti/Pt/Au. Furthermore, an n-type electrode 9 comprised of stacked films of AuGe/Ni/Au is formed below the substrate 1 in common for the laser diode A portion and laser diode B portion.

In a portion of the laser diode B, an n-InGaP buffer layer 2b, an n-cladding layer 3b comprised of n-AlGaInP, an active layer 4b comprised of GaInP, a p-cladding layer 5b comprised of p-AlGaInP, and a cap layer 6b comprised of p-GaAs are successively stacked on the n-GaAs buffer layer 2a. A high resistance layer 7b is formed on the surface of the p-cladding layer 5b leaving behind a striped shape central portion. The result is a gain guide type current constricting structure. At the upper portion of the cap layer 6b is formed a p-type electrode 8b comprised of Ti/Pt/Au.

As shown in FIG. 1B, a dielectric film 10 comprised of $Al_2O_3$ having a reflectance $n_1$ of 1.62 and a thickness $d_{10}$ of 222.2 nm is formed in common on the laser diode A portion and laser diode B portion at the front end F. Also, a first dielectric layer 11a comprised by $Al_2O_3$ having a thickness of $d_{11a}$ is formed in common on the laser diode A portion and the laser diode B portion on the rear end R. Furthermore, a second dielectric layer 11b comprised by amorphous silicon having a reflectance $n_2$ of 3.25 and a thickness $d_{11b}$ of 55.4 nm is formed on the surfaces thereof.

According to the semiconductor laser of the present embodiment, the thicknesses of all of the dielectric films 10, 11a, and 11b are optimized assuming that the wavelength of the laser light is the arithmetical mean of the oscillation wavelength of the laser diode A and the oscillation wavelength of the laser diode B. Namely, when a central wavelength of the laser light emitted from the laser diode A is 785 nm and a central wavelength of the laser light emitted from the laser diode B is 655 nm, the thickness is set using a midpoint of the two values, 720 nm, as a reference.

Also, the reflectance cyclically changes along with an increase in the thickness, but the minimum value among the plurality of thicknesses giving the identical reflectance is made the thickness. As a result, the film forming time can be shortened and the production efficiency improved and the variation in film formation can be prevented from becoming noticeable by increasing the thickness.

Assuming that the wavelength of the laser light is 720 nm, the optimized value $d_{10}$ of the thickness of the dielectric film 10 formed on the front ends F of the laser diode A and the laser diode B can be defined by the following formula.

$$d_{10} = (\lambda/2)/n_1 \approx 222.2 \text{(nm)} \qquad \ldots (4)$$

Further, the optimized values $d_{11a}$ and $d_{11b}$ of thicknesses of the dielectric films 11a and 11b formed on the rear end R are respectively defined by the following formulas.

$$d_{11a} = (\lambda/4)/n_1 \approx 111.1 \text{(nm)} \qquad \ldots (5)$$

$$d_{11b} = (\lambda/4)/n_2 \approx 55.4 \text{(nm)} \qquad \ldots (6)$$

Figure 2:
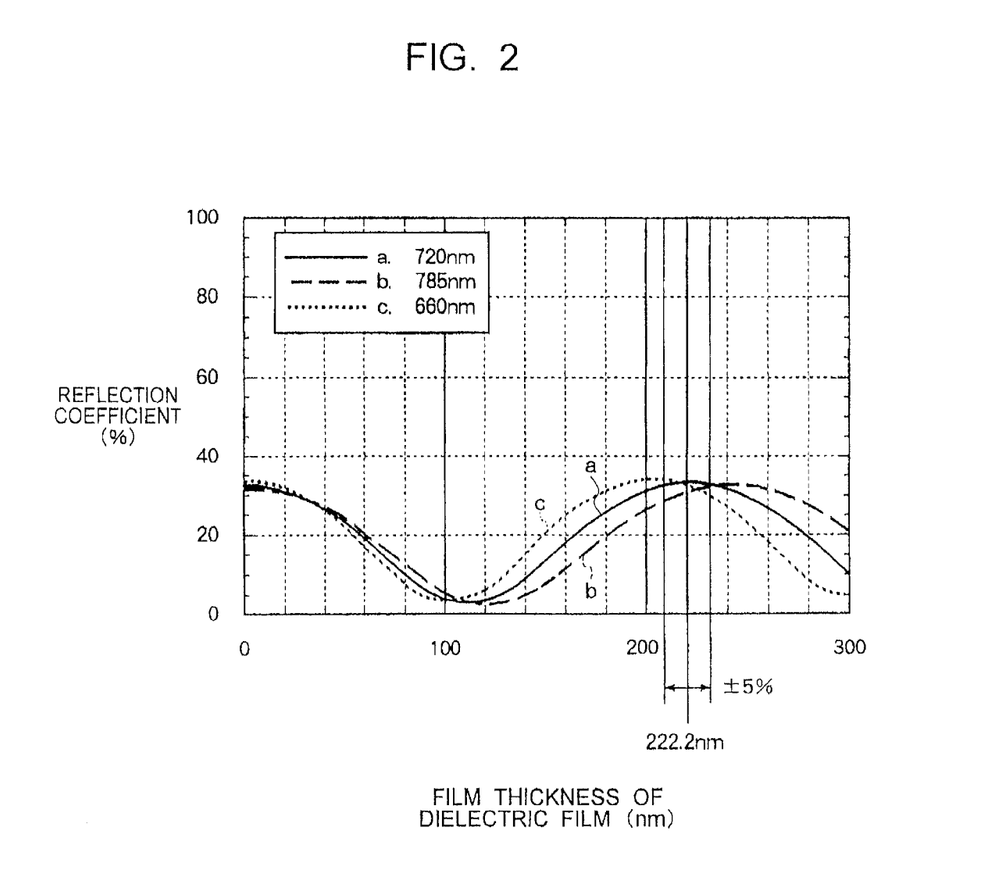
FIG. 2 is a view of the relationship of a thickness of a dielectric film formed on a front end of a semiconductor laser according to an embodiment of the present invention, and a reflectance.
Figure 3:
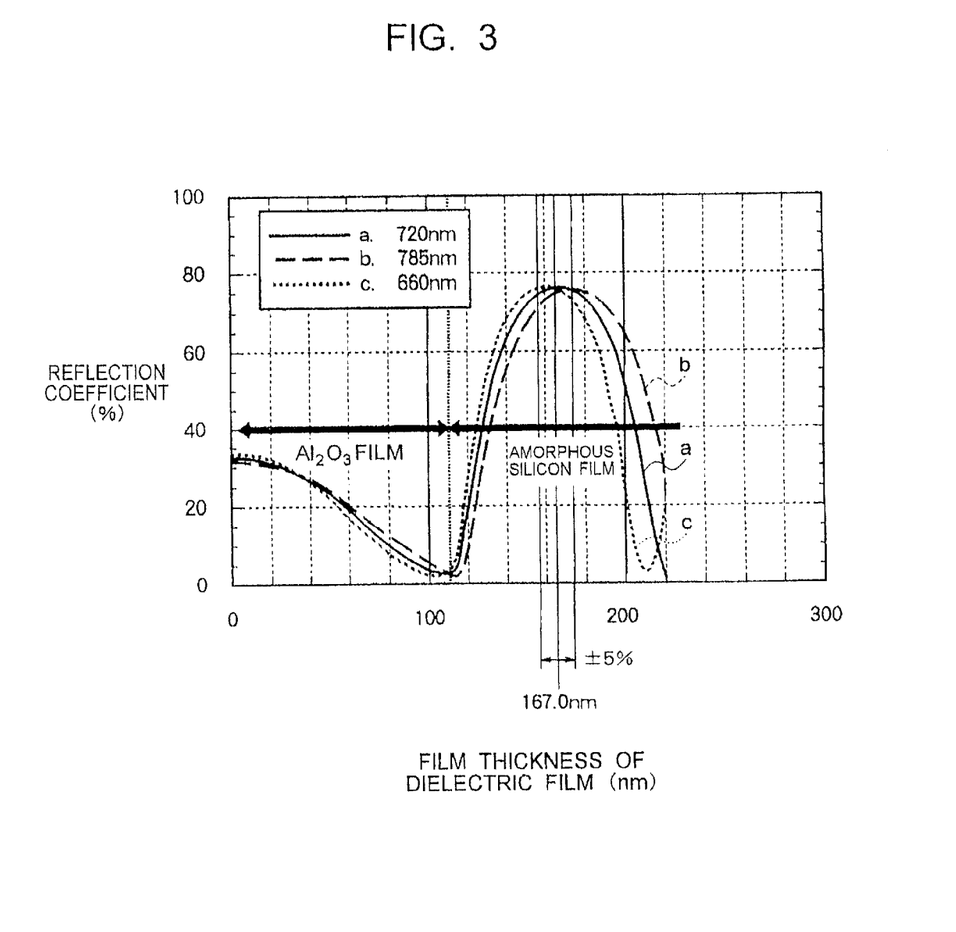
FIG. 3 is a view of the relationship of a thickness of a dielectric film formed on a rear end of a semiconductor laser according to an embodiment of the present invention, and a reflectance.

FIG. 2 shows the relationship between the thickness of the dielectric film formed on the front end of the semiconductor laser of the present embodiment and the reflectance. FIG. 3 shows the relationship between the thickness of the dielectric film formed on the rear end of the semiconductor laser of the present embodiment and the reflectance.

In FIGS. 2 and 3, a curve a indicates the results of a simulation conducted in the case of an arithmetical mean of the oscillation wavelength of two laser diodes of 720 nm, b an oscillation wavelength of the laser diode A is 785 nm, and c an oscillation wavelength of the laser diode B of 660 nm. The b and c are shown for comparison and reference.

The setting of the thickness of the dielectric film 10 formed on the front end F will be explained with reference to FIG. 2.

When forming the laser diodes A and B on the same substrate, as explained above, it is ideally preferable that a dielectric film 10 comprised by $Al_2O_3$ having a thickness of 242.3 nm be formed on the laser diode A having a wavelength of 785 nm and a dielectric film 10 comprised by $Al_2O_3$ having a thickness of 203.7 nm being formed on the laser diode B having a wavelength of 660 nm from a similar calculation. These values are equivalent to thicknesses when the reflectances become the extremal values in the curves b and c in FIG. 2.

However, when dielectric films 10 having different thicknesses are formed on the laser diodes A and B, the production process becomes complex. Therefore, when optimizing the thicknesses of the dielectric films 10 based, for example, on the oscillation wavelength of the laser diode B, the thicknesses becomes 203.7 nm. As shown in FIG. 2, a value of the curve c becomes the extremal value at the thickness of 203.7 nm and a reflectance of 33.5% is obtained in the range of 203.7 nm±5%. Also, since it is close to the extremal value of the reflectance, the reflectance fluctuates only a little even when there is variation in the thickness and the refractive index caused by the variation in film formation.

On the other hand, at the oscillation wavelength of 785 nm of the laser diode A, the reflectance becomes 26.7% when the thickness of the dielectric film 10 is 203.7 nm±5% as shown in the curve b in FIG. 2. The extremal value of the curve b is 31.8% at the thickness of 242.3 nm and clearly declines at a thickness of near 203.7 nm. Also, the reflectance often largely fluctuates due to variation in film formation near a thickness of 203.7 nm compared with when near the extremal value.

When optimizing the thickness of the dielectric film 10 based on the arithmetical mean of the two oscillation wavelengths, that is, 720 nm, the thickness $d_{10}$ becomes 222.2 nm. It is understood that a reflectance of 30.5% with respect to light having a wavelength of 785 nm and 31.8% with respect to light having a wavelength of 660 nm can be respectively obtained from the values of curves b and c at the thickness of 222.2 nm±5%. Also, since the thickness $d_{10}$ is near the extremal value for the curves b and c, the fluctuation of the reflectance is small.

Next, the setting of the thicknesses of dielectric films 11a and 11b formed at the rear end R will be explained with reference to FIG. 3. As explained above, it is ideally preferable that a first dielectric film 11a comprised of $Al_2O_3$ having a thickness of 121.1 nm and a second dielectric film 11b comprised of amorphous silicon having a thickness of 60.4 nm are formed on the laser diode A of a wavelength of 785 nm and that, from a similar calculation, a first dielectric film 11a comprised by $Al_2O_3$ having a thickness of 101.9 nm and a second dielectric film 11b comprised by amorphous silicon having a thickness of 50.8 nm are formed on the laser diode B of a wavelength of 660 nm. As a result, a reflectance of more than 70% can be obtained at the extremal value as shown by the curve b for the laser diode A and the curve c for the laser diode B.

However, since the dielectric films formed on the rear end R are multiple layers, the number of production steps increase more when forming dielectric layers 11a and 11b having different thicknesses on the laser diodes as explained above than when forming dielectric films 10 having different thicknesses on the front end F of the laser diodes.

When making the thicknesses of the dielectric films 11a and 11b of the two laser diodes the same and optimizing the value for one laser diode so as to prevent the increase of the production steps, it suffers from the following disadvantage.

For example, when the thickness is made one at which the curve b becomes the extremal value based on the oscillation wavelength of the laser diode A, the reflectance becomes around 65% at the curve b, while the reflectance largely fluctuates at the curve c since it is not near the extremal value. Namely, a sufficiently large stable reflectance cannot be obtained at the laser diode B.

On the other hand, when the thickness is made one at which the curve c becomes the extremal value based on the oscillation wavelength of the laser diode B, a stable reflectance of more than 70% cannot be obtained at the laser diode A in the same way.

According to the semiconductor laser of the present embodiment, as shown in the curve a, the thicknesses of the dielectric films 11a and 11b are optimized after assuming that the oscillation wavelength is 720 nm. Namely, the sum of the thicknesses of the dielectric films 11a and 11b is set to be 167.0 nm±5% at which the reflectance becomes the extremal value. The reflectance becomes 75.0% at the curve b and 75.5% at the curve c in this thickness range, and both of the curves b and c become near their extremal values. Therefore, sufficiently large reflectances are obtained in the laser diodes A and B and the fluctuation in reflection due to variation in the thickness etc. can be reduced.

Next, the method of production of a semiconductor laser of the present embodiment above will be explained.

Figure 4A:
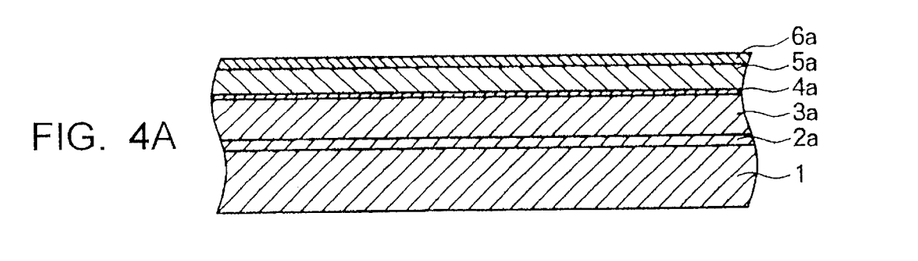
FIGS. 4A to 4F are views of production steps of a method of producing a semiconductor laser according to an embodiment of the present invention.

First, as shown in FIG. 4A, for example, a buffer layer 2a comprised of n-GaAs, an n-cladding layer 3a comprised of n-AlGaAs, an active layer 4a having a multiple quantization well structure including a GaAs layer, a p-cladding layer 5a comprised of p-AlGaAs, and a cap layer 6a comprised of p-GaAs are successively stacked on a substrate 1 comprised for example of n-GaAs by epitaxial growth such as metal organic vapor phase epitaxial growth (MOVPE).

Figure 4B:
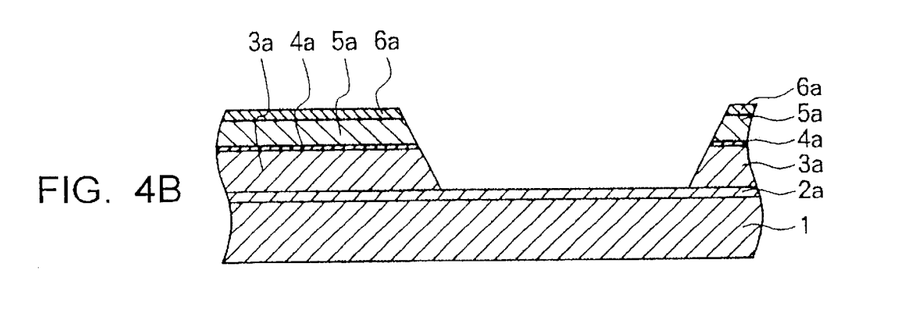

Next, as shown in FIG. 4B, the laser diode A portion is protected by a resist (not shown), and wet etching, such as non-selective etching using a sulfuric acid-based solution and selective etching on AlGaAs using a fluoric acid-based solution, is performed. The stack above from the n-cladding layer formed on the laser diode B portion is removed by the etching.

Figure 4C:
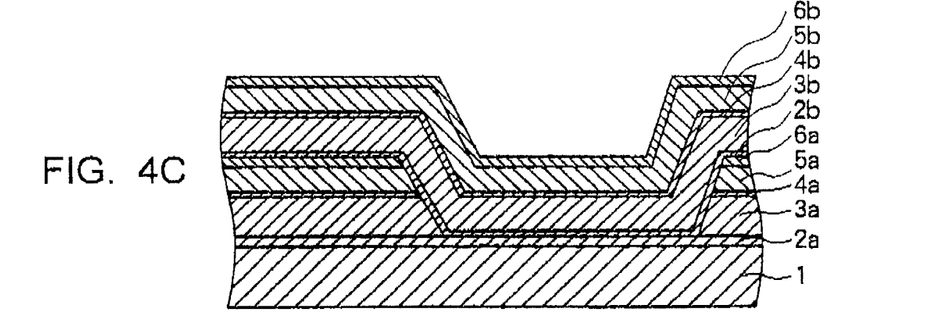

Next, as shown in FIG. 4C, a buffer layer 2b comprised for example of n-AlGaP is formed on a cap layer 6a on the buffer layer 2a and other area on the B portion of the laser diode by epitaxial growth such as metal organic vapor phase epitaxial growth. Further above thereon, an n-cladding layer 3b comprised for example of n-AlGaInP, an active layer 4b having a multiple quantization well structure including for example GaInP layer, a p-cladding layer 5b comprised for example of p-AlGaInP, and a cap layer 6b comprised of p-GaAs are successively stacked in that order.

Figure 4D:
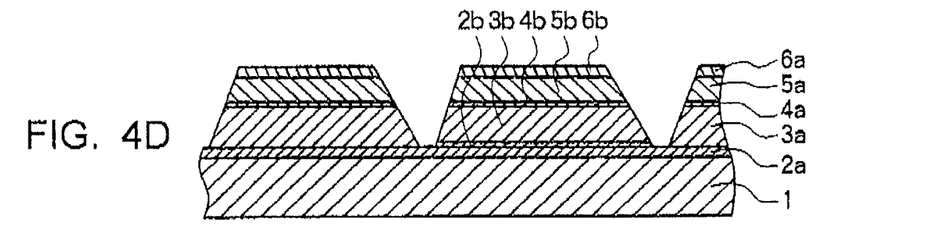

Next, as shown in FIG. 4D, after protecting the laser diode B portion with a resist (not shown), the cap layer 6b on the portion other than the laser diode B portion is removed by wet etching using for example a sulfuric acid-based solution. Furthermore, by performing wet etching using for example a phosphoric acid/hydrochloric acid-based solution, the p-cladding layer 5b, the active layer 4b, n-cladding layer 3b, and buffer layer 2b other than the laser diode B portion are removed. Then, wet etching is performed using a hydrochloric acid-based solution to form a trench reaching the buffer layer 2a. As a result, the laser diodes are separated.

Figure 4E:
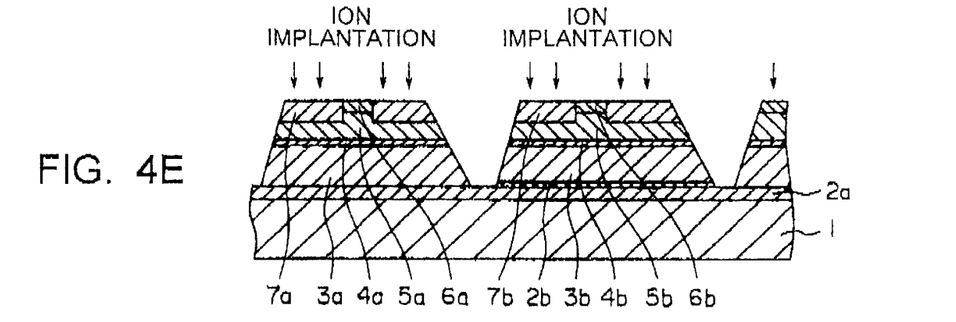

Next, as shown in FIG. 4E, the portions to become the current introduction areas of the laser diodes are protected by a resist (not shown) and ion implantation of n-type impurities is performed on the surface of the p-cladding layers 5a and 5b. As a result, high resistance layers 7a and 7b are formed in the ion implanted areas resulting in a gain guide type current constricting structure.

Figure 4F:
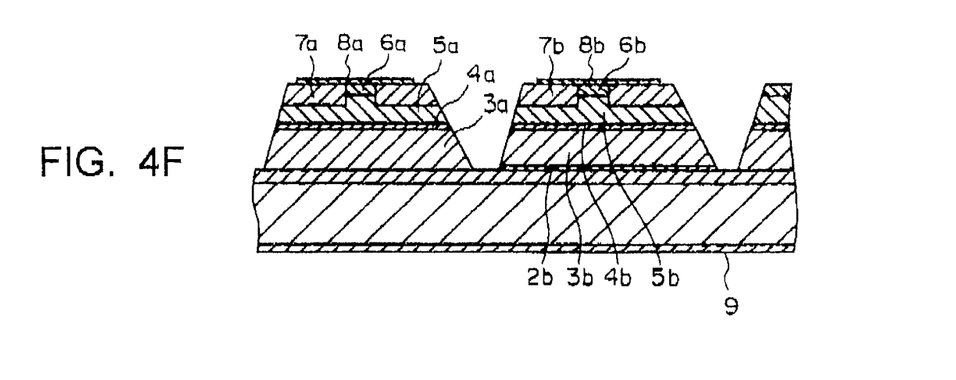

Next, as shown in FIG. 4F, stacked films of for example Ti/Pt/Au are formed by sputtering on the cap layers 6a and 6b to form p-type electrodes 8a and 8b on the laser diodes A and B. Also, on the opposite side of the side where the laser diodes A and B of the substrate 1 are formed, a multi-layer film of for example AuGe/Ni/Au is formed by sputtering to form an n-type electrode 9.

Then, through a pelletizing process, a sectional structure shown in FIG. 1A is attained having two laser diodes of different oscillation wavelengths on the same substrate 1.

Next, as shown in the top view of FIG. 1B, a dielectric film 10 having a predetermined thickness set based on an arithmetical mean of an oscillation wavelength of the laser diode A and that of the laser diode B is formed on the front end F. In the same way, dielectric films 11a and 11b having a predetermined thickness set based on the arithmetical mean of the oscillation wavelengths of the two laser diodes are formed on the rear end R. The dielectric films are formed for example by sputtering.

From the above process, a semiconductor laser of the present embodiment is formed.

According to the method of production of the semiconductor laser of the present embodiment, it is possible to monolithically form a plurality of laser diodes having different oscillation wavelengths and to form dielectric films with little fluctuation in the reflectance on the front end and the rear end of the respective laser diodes by a simple procedure. By forming dielectric films having predetermined thicknesses on the ends of the laser diodes, the energy conversion efficiency and the front/rear output ratio of the laser diodes can be controlled while protecting the ends.

Also, according to the method of production of the semiconductor laser of the present embodiment, the minimum value is set among the plurality of thickness values giving the same reflectance. Accordingly, the film formation time can be made short, the production efficiency can be raised, and the variation in the film formation can be prevented from becoming noticeable as the thickness increases.

The embodiments of the semiconductor laser and the method of production of the present invention are not limited to the above explanation. For example, a case of combining wavelengths of the 780 nm band and the 650 nm band was shown in the above embodiment but another combination of wavelengths is also possible.

Also, the present invention can be applied to a case of a monolithic semiconductor laser having three or more laser diodes. For example, it is possible to set an arithmetical mean of three oscillation wavelengths and to set thicknesses of dielectric films based on reflectances of the dielectric films.

Other than that, a variety of modifications can be made within the scope of the present invention.

According to the semiconductor laser of the present invention, it becomes possible to provide a semiconductor laser capable of emitting a plurality of laser light having different wavelengths which suppresses fluctuation of the reflectance of an end of an active layer and to stabilize an output of laser light at the different oscillation wavelengths.

According to the method of production of the semiconductor laser of the present invention, it becomes possible to form dielectric films with reflectances stable with respect to a plurality of laser light different in oscillation wavelengths by a simple procedure on the ends of a multiple wavelength monolithic semiconductor laser.

While the invention has been described with reference to specific embodiment chosen for purpose of illustration, it should be apparent that numerous modifications could be made thereto by those skilled in the art without departing from the basic concept and scope of the invention.

What is claimed is:

1. A semiconductor laser device comprising:
    a substrate;
    a plurality of lasers carried on said substrate;
    a plurality of active layers of different compositions on said substrate corresponding to said plurality of lasers and emitting in parallel a plurality of laser lights of different oscillation wavelengths,
    each laser having a front surface coating film formed on a front end laser emission side of said laser in correspondence with its laser light, and
    each laser having a rear surface coating film formed on a rear surface of said laser in correspondence with its laser light, said rear surface coating film having a higher reflectance than that of said front surface coating film,
    wherein,
        thicknesses of said front surface and said rear surface coating films are predetermined to provide reflectances of extremal values with respect to light of a predetermined wavelength between the minimum value and the maximum value of said oscillation wavelengths.

2. A semiconductor laser as set forth in claim 1, wherein said predetermined wavelength is defined as an arithmetical average of said oscillation wavelengths of said plurality of laser lights.

3. A semiconductor laser as set forth in claim 1, wherein said front surface coating film comprises a dielectric.

4. A semiconductor laser as set forth in claim 1, wherein said rear surface coating film comprises a dielectric.

5. A semiconductor laser as set forth in claim 1, wherein two or more of said lasers share a front surface coating film in common.

6. A semiconductor laser as set forth in claim 1, wherein two or more of said lasers share a rear surface coating film in common.

7. A semiconductor laser as set forth in claim 2, wherein said predetermined thickness of said front surface coating film is defined as a value expressed by $(\lambda/2)/n_F$, where $\lambda$ is the predetermined wavelength and $n_F$ is the reflectance of said front surface coating film.

8. A semiconductor laser as set forth in claim 2, wherein:
    said rear surface coating film comprises stacked films of a first rear surface coating film having a reflectance $n_{Ra}$ and a second rear surface coating film having a reflectance $n_{Rb}$;
    said predetermined thickness of said first rear surface coating film is defined as a value expressed by $(\lambda/4)/n_{Ra}$, where $\lambda$ is the predetermined wavelength; and
    said predetermined thickness of said second rear surface coating film is defined as a value expressed by $(\lambda/4)/n_{Rb}$.

9. A semiconductor laser as set forth in claim 1, wherein said active layer is formed at an interlayer bonding portion of a first conductivity type cladding layer and a second conductivity type cladding layer.

10. A semiconductor laser as set forth in claim 9, wherein said active layer has a current constricting structure.

* * * * *